US006864040B2

(12) United States Patent
Müller et al.

(10) Patent No.: US 6,864,040 B2
(45) Date of Patent: Mar. 8, 2005

(54) THERMAL INITIATOR SYSTEM USING LEUCO DYES AND POLYHALOGENE COMPOUNDS

(75) Inventors: Ursula Müller, Herzberg am Harz (DE); Tobias Wittig, Osterode/Harz (DE); Hans-Joachim Timpe, Osterode/Harz (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 368 days.

(21) Appl. No.: 09/832,989

(22) Filed: Apr. 11, 2001

(65) Prior Publication Data

US 2003/0003399 A1 Jan. 2, 2003

(51) Int. Cl.[7] ......................... G03F 7/031; G03F 7/038; G03F 7/11; G03F 7/029

(52) U.S. Cl. ................................ 430/287.1; 430/281.1; 430/282.1; 430/283.1; 430/284.1; 430/285.1; 430/286.1; 430/944; 430/926; 430/925; 430/920; 430/919; 430/917; 430/918; 430/915; 430/916; 430/945; 430/302; 430/300; 522/2; 522/25; 522/26; 522/27; 522/28; 522/30

(58) Field of Search ........................... 430/281.1, 282.1, 430/283.1, 284.1, 285.1, 286.1, 287.1, 944, 926, 925, 920, 919, 917, 918, 915, 916; 522/2, 25, 26, 27, 28, 30

(56) References Cited

U.S. PATENT DOCUMENTS

| | | | | |
|---|---|---|---|---|
| 3,359,109 A | | 12/1967 | Harder et al. | 96/90 |
| 4,189,323 A | * | 2/1980 | Buhr | 430/281.1 |
| 4,743,531 A | * | 5/1988 | Farid et al. | 430/281.1 |
| 4,940,647 A | | 7/1990 | Frommeld et al. | 430/271.1 |
| 4,997,745 A | | 3/1991 | Kawamura et al. | 430/281.1 |
| 5,322,762 A | | 6/1994 | Kushi et al. | 430/288.1 |
| 5,491,046 A | | 2/1996 | DeBoer et al. | 430/302 |
| 5,496,903 A | | 3/1996 | Watanabe et al. | 526/204 |
| 5,545,676 A | | 8/1996 | Palazzotto et al. | 522/15 |
| 5,658,708 A | | 8/1997 | Kondo | 430/288.1 |
| 5,756,258 A | | 5/1998 | Yamaoka et al. | 430/281.1 |
| 5,763,134 A | | 6/1998 | Busman et al. | 430/157 |
| 6,482,571 B1 | * | 11/2002 | Teng | 430/302 |

FOREIGN PATENT DOCUMENTS

| | | |
|---|---|---|
| DE | 19648313 | 5/1997 |
| EP | 0251049 | 1/1988 |
| EP | 0311926 | 4/1989 |
| EP | 0 438 123 A2 | 7/1991 |
| EP | 0522175 | 1/1993 |
| EP | 0672544 | 9/1995 |
| EP | 0672954 | 9/1995 |
| EP | 0730201 | 9/1996 |
| EP | 0819980 | 1/1998 |
| EP | 0819985 | 1/1998 |
| EP | 0823327 | 2/1998 |
| EP | 0941866 | 9/1999 |
| GB | 2307474 | 5/1997 |
| JP | 0934110 | 2/1997 |
| JP | 1138633 | 2/1999 |
| WO | 9739894 | 10/1997 |
| WO | 0048836 | 8/2000 |

OTHER PUBLICATIONS

March, Jerry, Advanced Organic Chemistry: Reactions, Mechanisms, and Structure, Second Edition, McGraw–Hill series in advanced chemistry, McGraw–Hill, Inc., 1977, pp. 41–69, "AROMATICITY".*

European Search Report dated Nov. 17, 2003, 3 pages.

* cited by examiner

*Primary Examiner*—Cynthia Hamilton
(74) *Attorney, Agent, or Firm*—Faegre & Benson LLP

(57) ABSTRACT

The present invention relates to IR-sensitive compositions containing an initator system comprising:

(a) at least one compound capable of absorbing IR radiation selected from triarylamine dyes, thiazolium dyes, indolium dyes, oxazolium dyes, cyanine dyes, polyaniline dyes, polypyrrole dyes, polythiophene dyes and phthalocyanine pigments (b) at least one compound capable of producing radicals selected from polyhaloalkyl-substituted compounds (c) at least one polycarboxylic acid represented by the following formula I $$R^4—(CR^5R^6)_r—Y—CH_2COOH \quad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with -COOH, $R^8$ is selected from the group consisting of —$CH_2COOH$, —$CH_2OH$ and —$(CH_2)_2N(CH_2COOH)_2$ and r is 0, 1, 2 or 3 with the proviso that at least one of $R^4$, $R^5$, R6, $R^7$ and $R^8$ comprises a —COOH group or salts thereof, and (d) at least one leuco dye, wherein the following inequation is met:

$$ox_a<red_b+1.6eV$$

with $ox_a$=oxidation potential of component (a) in eV $red_b$= reduction potential of component (b) in eV These compositions are inter alia extraordinarily suitable for the manufacture of printing plates.

32 Claims, No Drawings

THERMAL INITIATOR SYSTEM USING LEUCO DYES AND POLYHALOGENE COMPOUNDS

FIELD OF THE INVENTION

The present invention relates to initiator systems and IR-sensitive compositions containing them which, inter alia, are extraordinarily suitable for the manufacture of printing plate precursors which can be imagewise exposed with IR-radiation.

BACKGROUND OF THE INVENTION

Nowadays, radiation-sensitive compositions usable particularly for high-performance printing plate precursors must fulfill high requirements.

The discussion of improving the properties of radiation-sensitive compositions and thus also of the corresponding printing plate precursors essentially deals with two different ways. One of them deals with the improvement of the properties of the radiation-sensitive components in the compositions (frequently negative diazo resins or photoinitiators), the other one with the search for novel polymeric compounds ("binders") which are to control the physical properties of the radiation-sensitive layers. The first way is of particular importance if the sensitivity of printing plate precursors is to be adjusted to certain ranges of electromagnetic radiation. Also, the shelf-life and radiation-sensitivity of the materials are strongly influenced by the nature of such initiator systems.

The latest developments in the field of printing plate precursors deal with radiation-sensitive compositions which can be imagewise exposed by means of lasers or laser diodes. This type of exposure does not require films as inter-mediate information carriers since lasers can be controlled by computers.

High-performance lasers or laser diodes which are used in commercially available image-setters emit light in the wavelength ranges of between 800 to 850 nm and between 1060 and 1120 nm, respectively. Therefore, printing plate precursors, or initiator systems contained therein, which are to be imagewise exposed by means of such image-setters have to be sensitive in the near IR range. Such printing plate precursors can then basically be handled under daylight conditions which significantly facilitates their production and processing. There are two different possibilities of producing radiation-sensitive compositions for such printing plates.

For negative printing plates, radiation-sensitive compositions are used wherein after an imagewise exposure the exposed areas are cured. In the developing step only the unexposed areas are removed from the substrate. For positive printing plates, radiation-sensitive compositions are used whose exposed areas dissolve faster in a given developing agent than the non-exposed areas. This process is referred to as photosolubilization.

However, with regard to the radiation-sensitive compositions in positive systems, there is a certain dilemma since for a high number of copies crosslinked polymers are needed. However, such products are insoluble in the solvents or solvent mixtures suitable for the plate coating so that again non-crosslinked or only slightly crosslinked starting products are needed. The necessary crosslinking can then be achieved by preheating steps which can be carried out at various stages of the plate processing.

A positive system is described in EP-A-0 819 980 where it is assumed that the non-image areas are formed by a reaction of the formed acid with carbon black. The image areas are only formed during a preheating step; for a high number of copies the image areas have to be baked.

Another positive system is described in U.S. Pat. No. 5,658,708. The necessary crosslinking of the layer is already carried out during the drying step of the coating. However, for that purpose the system has to be treated at 120° C. for 10 minutes whereby chemical processes take place which eventually lead to crosslinking. However, the required relatively long heating periods at such high temperatures represent an unacceptable waste of time in today's typical fully automated plate production lines. Baking does not lead to an increase in the number of copies since the crosslinking is partly undone.

Documents EP-A-0 823 327 and WO97/39894 also describe positive compositions. As is the case with many positive systems, they entail the disadvantage that a complicated conditioning step is necessary in order to ensure a sufficient shelf-life of the plates. Furthermore, a baking step is required to obtain high numbers of copies and a good solvent resistance.

Plates which can be imagewise exposed with IR lasers are furthermore known from EP-A-0 672 544, EP-A-0 672 954 as well as U.S. Pat. No. 5,491,046 and EP-A-0 819 985. These plates are negative-working and after imagewise exposure they require a preheating step within a very narrow temperature range which only causes a partial crosslinking of the image layer. In order to meet the highest requirements regarding the number of copies and to show sufficient resistance to printing chamber chemicals an additional heating step—what is referred to as baking—is carried out during which these layers are crosslinked further.

All the systems described so far have the additional disadvantage that a relatively high laser performance ($\geqq$150 mJ/cm$^2$) is required; for some applications (e.g. newsprinting) this represents a disadvantage since the provision of the necessary number of exposed printing plates within a short period of time is problematic.

U.S. Pat. No. 4,997,745 describes photosensitive compositions comprising a dye absorbing in the visible range and a trihalomethyl-s-triazine compound. However, these compositions are not sensitive in the IR-range and meet neither today's high requirement regarding photosensitivity nor that of a long shelf-life. In U.S. Pat. No. 5,496,903 and DE-A-196 48 313 photosensitive compositions are described which in addition to a dye absorbing in the IR range comprise borate co-initiators; also, halogenated s-triazines are described as further co-initiators. Although these compositions show an improved photosensitivity, the thus produced printing plates do not meet the present-day requirement of a long shelf-life. After only one month of storage at room temperature, the entire layer of the printing plate has cured to such a degree that an image can no longer be created after exposure and developing of the plate.

Further photopolymerizable compositions with initiator systems are described in U.S. Pat. No 5,756,258, U.S. Pat. No. 5,545,676, JP-A-11-038633, JP-A-09-034110, U.S. Pat. No. 5,763,134 and EP-B-0 522 175.

Radiation-sensitive compositions which show both a high degree of radiation sensitivity and a sufficiently long shelf-life when used in the manufacture of printing plate precursors are presently only known in connection with UV-absorbing dyes (EP-A-0 730 201). However, printing plate precursors using such compositions have to be manufactured and processed under darkroom conditions and cannot be imagewise exposed by means of the above-mentioned lasers or laser diodes. Particularly the fact that they cannot be processed in daylight limits their possibilities of application.

WO 00/48836 describes IR-sensitive compositions comprising besides a polymeric binder and a free radically polymerizable system an initiator system comprising (a) at least one compound capable of absorbing IR radiation, (b) at least one compound capable of producing radicals and (c) at least one polycarboxylic acid comprising an aromatic moiety substituted with a heteroatom selected from N, O and S and at least two carboxyl groups, wherein at least one of the carboxyl groups is bonded to the heteroatom via a methylene group. The compositions may furthermore contain a colorant for increasing the contrast of the image compared to the background after development.

It would, however, be desirable to further improve the IR sensitivity.

SUMMARY OF THE INVENTION

It is therefore the object of the present invention to provide IR-sensitive compositions which allow the manufacture of negative printing plate precursors having a long shelf-life, providing a continuously high number of copies and a high degree of resistance to press room chemicals, and which are additionally characterized by an improved IR sensitivity.

Another object underlying this invention is the use of such IR-sensitive compositions for preparing negative printing plate precursors.

These objects are achieved by an IR-sensitive composition comprising in addition to a polymeric binder a free radical polymerizable system consisting of at least one member selected from unsaturated free radical polymerizable monomers, oligomers which are free radical polymerizable and polymers containing C=C bonds in the back bone and/or in the side chain groups and an initiator system, wherein the initiator system comprises the following components:

(a) at least one compound capable of absorbing IR radiation selected from triarylamine dyes, thiazolium dyes, indolium dyes, oxazolium dyes, cyanine dyes, polyaniline dyes, polypyrrole dyes, polythiophene dyes and phthalocyanine pigments (b) at least one compound capable of producing radicals selected from polyhaloalkyl-substituted compounds (c) at least one polycarboxylic acid represented by the following formula I $$R^4—(CR^5R^6)_r—Y—CH_2COOH \quad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with —COOH, $R^8$ is selected from the group consisting of —$CH_2COOH$, —$CH_2OH$ and —$(CH_2)_2N(CH_2COOH)_2$ and r is 0, 1, 2 or3 with the proviso that at least one of $R^4$, $R^5$, $R^6$, $R^7$ and $R^8$ comprises a —COOH group or salts thereof.

(d) at least one leuco dye wherein the following inequation is met:

$$ox_a < red_b + 1.6 eV$$

with $ox_a$=oxidation potential of component (a) in eV $red_b$ reduction potential of component (b) in eV

DETAILED DESCRIPTION OF THE INVENTION

Useful infrared absorbing compounds typically have a maximum absorption wave length in some part of the electromagnetic spectrum greater than about 750 nm; more particularly, their maximum absorption wavelength is in the range from 800 to 1100 nm.

The at least one compound (a) is selected from triarylamine dyes, thiazolium dyes, indolium dyes, oxazolium dyes, cyanine dyes, polyaniline dyes, polypyrrole dyes, polythiophene dyes and phthalocyanine pigments, preferably cyanine dyes.

It is more preferred that component (a) is a cyanine dye of the formula (A)

(A)

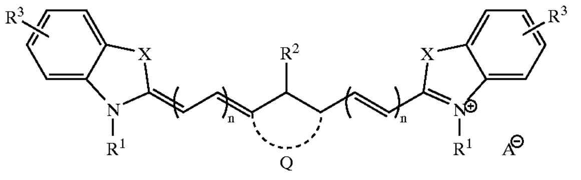

wherein:

each X independently represents S, O, NR or $C(alkyl)_2$;

each $R^1$ independently is an alkyl group, an alkylsulfonate or an alkylammonium group;

$R^2$ represents hydrogen, halogen, SR, $SO_2R$, OR or $NR_2$;

each $R^3$ independently represents a hydrogen atom, an alkyl group, COOR,OR, SR, $NR_2$, a halogen atom or an optionally substituted benzofused ring;

$A^-$ represents an anion;

- - Q - - represents an optional carbocyclic five- or six-membered ring;

each R independently represents hydrogen, an alkyl or aryl group;

each n independently is 0, 1, 2 or 3.

If $R^1$ is an alkylsulfonate group $A^-$ can be absent (formation of an inner salt); otherwise an alkali metal cation is necessary as counterion. If $R^1$ is an alkyl-ammonium group a second anion is necessary as counterion; this second anion may be the same as $A^-$ or a different one.

These dyes absorb in the range of 750 to 1100 nm; dyes of the formula (A) which absorb in the range of 810 to 860 nm are preferred.

X is preferably a $C(alkyl)_2$ group.

$R^1$ is preferably an alkyl group with 1 to 4 carbon atoms.

$R^2$ is preferably SR.

$R^3$ is preferably a hydrogen atom.

R is preferably an alkyl or aryl group; especially preferred is a phenyl group.

The broken line preferably represents the rest of a ring with 5 or 6 carbon atoms.

The counterion $A^-$ is preferably a chloride ion or a tosylate anion.

Especially preferred are IR dyes with a symmetrical formula (A). Examples of such especially preferred dyes include:

2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride,

2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride, 2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indoliumtosylate, 2-[2-[2-chloro-3-[2-ethyl-(3H-benzthiazole-2-ylidene)-ethylidene]-1-cyclohexen-1-yl]-ethenyl]-3-ethyl-benzthiazolium-tosylate and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium-tosylate.

Also useful IR absorbers for the compositions of the present invention are the following compounds:

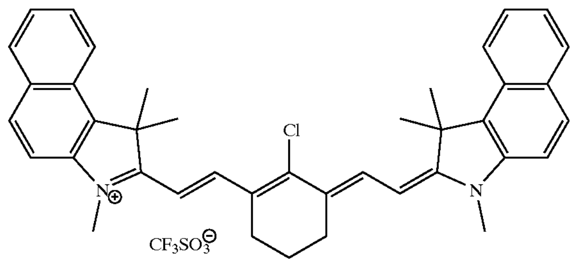

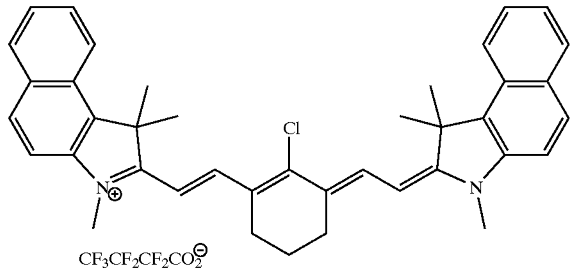

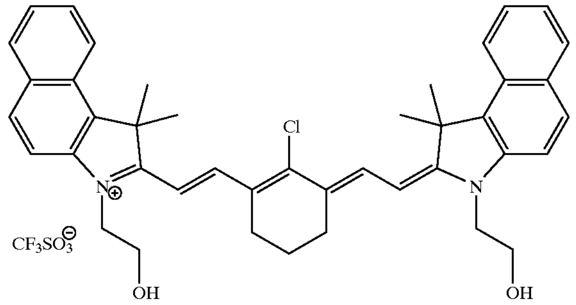

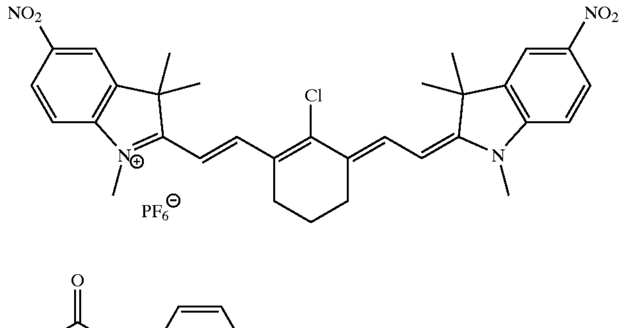

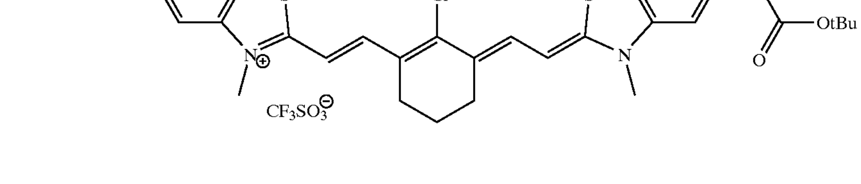

-continued
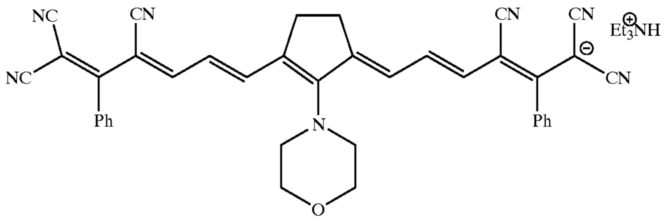
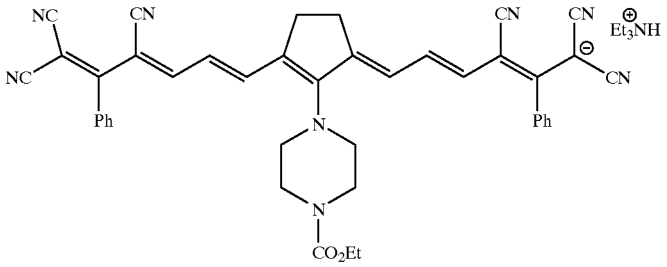
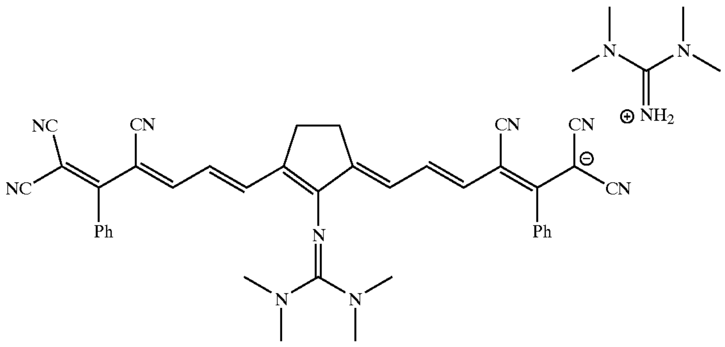
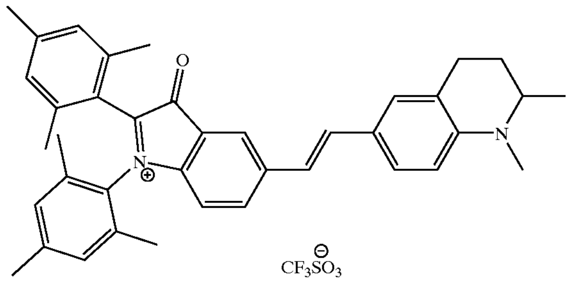
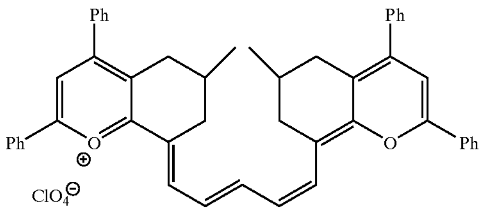
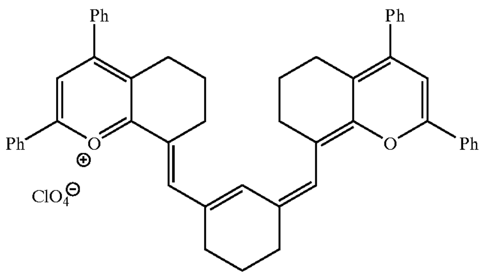

The IR absorber (a) is preferably present in the IR-sensitive composition in an amount of from 1 to 8 wt.-%, based on the total solids content of the IR-sensitive composition; especially preferred is an amount of from 1.5 to 3 wt.-%.

Another essential component of the initiator system is the compound capable of producing radicals. This compound is selected from polyhaloalkyl-substituted compounds. These are compounds which comprise at least either one polyhalogenated or several monohalogenated alkyl substituents. The halogenated alkyl group preferably has 1 to 3 carbon atoms; especially preferred is a halogenated methyl group.

The absorption properties of the polyhaloalkyl-substituted compound fundamentally determine the daylight stability of the IR-sensitive composition. Compounds having a UV/VIS absorption maximum of>330 nm result in compositions which can no longer be completely developed after the printing plate has been kept in daylight for 6 to 8 minutes and then been reheated. As a principle, such compositions can be imagewise exposed not only with IR but also with UV radiation. If a high degree of daylight stability is desired, polyhaloalkyl-substituted compounds are preferred which do not have a UV/VIS absorption maximum at>330 nm.

Examples of especially suitable compounds (b) for the compositions of the present invention include:

2-(4-methoxyphenyl)-4,6-bis(trichloromethyl)-s-triazine
2-(4-chlorophenyl)-4,6-bis-(trichloromethyl)-s-triazine
2-phenyl-4,6-bis(trichloromethyl)-s-triazine
2,4,6-tri-(trichloromethyl)-s-triazine
2,4,6-tri-(tribromomethyl)-s-triazine
tribromomethyl phenylsulfone Compound (b) is preferably present in the IR-sensitive composition in an amount of from 2 to 15 wt.-%, based on the total solids content of the IR-sensitive composition; especially preferred is an amount of from 4 to 7 wt.-%.

The polycarboxylic acid (compound c) is represented by the following formula I $$R^4—(CR^5R^6)_r—Y—CH_2COOH \quad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with —COOH, $R^8$ is selected from the group consisting of —$CH_2COOH$, —$CH_2OH$ and —$(CH_2)_2N(CH_2COOH)_2$ and r is 0, 1, 2 or 3 with the proviso that at least one of $R^4$, $R^5$, $R^6$, $R^7$ and $R^8$ comprises a —COOH group or salts thereof.

As used herein the term "alkyl" includes straight chain and branched chain alkyl groups unless otherwise defined.

As used herein the term "aryl" refers to carbocyclic aromatic groups and heterocyclic aromatic groups wherein one or more heteroatoms independently selected from N, O and S are present in the aromatic ring system. Examples for carbocyclic aromatic groups are phenyl and naphthyl.

As used herein the expression "aryl which is optionally substituted" refers to an aryl group as defined above which optionally comprises one or more substituents independently selected from the group consisting of —COOH, —OH, $C_1$–$C_6$ alkyl, —CHO, —$NH_2$, halogen (i.e. fluorine, chlorine, bromine and iodine), $C_1$–$C_4$ alkoxy, acetamido, —$OCH_2COOH$, —$NHCH_2COOH$ and aryl.

Examples of such polycarboxylic acids include:

(p-acetamidophenylimino)diacetic acid
3-(bis(carboxymethyl)amino)benzoic acid
4-(bis(carboxymethyl)amino)benzoic acid
2-[(carboxymethyl)phenylamino]benzoic acid
2-[(carboxymethyl)phenylamino]-5-methoxybenzoic acid
3-[bis(carboxymethyl)amino]-2-naphthalenecarboxylic acid
N-(4-aminophenyl)-N-(carboxymethyl)glycine
N,N'-1,3-phenylenebisglycine
N,N'-1,3-phenylenebis[N-(carboxymethyl)]glycine
N,N'-1,2-phenylenebis[N-(carboxymethyl)]glycine
N-(carboxymethyl)-N-(4-methoxyphenyl)glycine
N-(carboxymethyl)-N-(3-methoxyphenyl)glycine
N-(carboxymethyl)-N-(3-hydroxyphenyl)glycine
N-(carboxymethyl)-N-(3-chlorophenyl)glycine
N-(carboxymethyl)-N-(4-bromophenyl)glycine
N-(carboxymethyl)-N-(4-chlorophenyl)glycine
N-(carboxymethyl)-N-(2-chlorophenyl)glycine
N-(carboxymethyl)-N-(4-ethylphenyl)glycine
N-(carboxymethyl)-N-(2,3-dimeth ylph enyl)glycine
N-(carboxymethyl)-N-(3,4-dimethylpheny l)glycine
N-(carboxymethyl)-N-(3,5-dimethylphenyl)glycine
N-(carboxymethyl)-N-(2,4-dimethylphenyl)glycine
N-(carboxymethyl)-N-(2,6-dimethylphenyl)glycine
N-(carboxymethyl)-N-(4-formylphenyl)glycine
N-(carboxymethyl)-N-ethylanthranilic acid
N-(carboxymethyl)-N-propylanthranilic acid
N-(carboxymethyl)-N-benzyl-glycine
5-bromo-N-(carboxymethyl)anthranilic acid
N-(2-carboxyphenyl)glycine
o-dianisidine-N,N,N',N'-tetraacetic acid
4-carboxyphenoxyacetic acid
catechol-O,O'-diacetic acid
4-methylcatechol-O,O'-diacetic acid
resorcinol-O,O'-diacetic acid
hydroquinone-O,O'-diacetic acid
α-carboxy-o-anisic acid
4,4'-isopropylydenediphenoxyacetic acid
2,2'-(dibenzofuran-2,8-diyidioxy)diacetic acid
2-(carboxymethylthio)benzoic acid
5-amino-2-(carboxymethylthio)benzoic acid
3-[(carboxymethyl)thio]-2-naphthalenecarboxylic acid
ethylene diamine tetra-acetic acid
nitrilo tri-acetic acid
diethylene triamine penta-acetic acid
N-hydroxyethyl ethylene diamine tri-acetic acid.

A preferred group of polycarboxylic acids are N-arylpolycarboxylic acids, in particular those of the following formula (B)

(B)

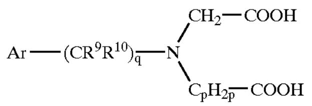

wherein Ar is a mono-, poly- or unsubstituted aryl group, p is an integer from 1 to 5, $R^9$ and $R^{10}$ are independently selected from the group consisting of hydrogen and $C_1$–$C_4$ alkyl and q is 0 or an integer from 1 to 3, and of the formula (C)

(C)

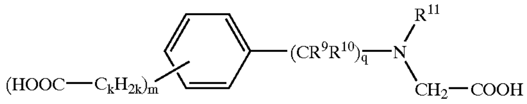

wherein $R^{11}$ represents a hydrogen atom or a $C_1$–$C_6$ alkyl group, k and m independently represent an integer from 1 to 5, and $R^9$, $R^{10}$ and q are as defined above.

A further preferred group of polycarboxylic acids are aliphatic poly-acetic acids with all —$CH_2COOH$ groups being bonded to (a) nitrogen atom(s) like ethylene diamine tetra-acetic acid, nitrilo tri-acetic acid, diethylene triamine penta-acetic acid and N-hydroxyethyl ethylene diamine tri-acetic acid.

Possible substituents of the aryl group in formula (B) are $C_1$–$C_3$ alkyl groups, $C_1$–$C_3$ alkoxy groups, $C_1$–$C_3$ thioalkyl groups and halogen atoms. The aryl group can have 1 to 3 identical or different substituents.

p is preferably 1; Ar preferably represents a phenyl group.

In formulae (B) and (C) preferably $R^9$ and $R^{10}$ are independently selected from hydrogen and methyl; more preferably $R^9$ and $R^{10}$ are both hydrogen.

q is preferably 0 or 1.

k is preferably 1 or 2; the same holds true for m.

$R^{11}$ is preferably hydrogen, methyl or ethyl.

The most preferred aromatic polycarboxylic acids are anilino diacetic acid and N-(carboxymethyl)-N-benzylglycine.

The polycarboxylic acid is preferably present in the IR-sensitive composition in an amount of from 1 to 10 wt.-%, especially preferred 1.5 to 3 wt.-%, based on the total solids content of the IR-sensitive composition.

Still another essential component is the leuco dye. Leuco dyes are one class of dye-releasing material that forms a dye upon oxidation. As used herein, a leuco dye is the reduced form of a dye that is generally colorless or very lightly colored and is capable of forming colored image upon oxidation of the leuco dye to the dye form.

Any leuco dye that converts to a differently colored form upon the removal of one or more hydrogen atoms is useful in the present invention. Most preferred are those leuco dyes in which the removable hydrogen(s) are not sterically hindered. The use of leuco dyes in radiation-sensitive compositions designed for imaging with either ultraviolet light (EP-B-0 251 049, EP-A-0 311 926), visible light (U.S. Pat. No. 5,322,762) or infrared light exposure (EP-A-0 941 866) is well known. These compositions are disclosed as color forming systems wherein the use of leuco dyes in IR sensitive compositions increases the room light stability of such compositions.

The leuco forms of the dyes which constitute one component of the compositions of the present invention are selected from triaryl methanes, xanthenes, thioxanthenes, 9,10-dihydroacridines, phenoxazines, phenothiazines, dihydrophenazines, hydrocinnamic acids, indigoid dyes, 2.3-dihydroanthraquinones, phenylethylanilines and indanones. Such compounds have been described, for example, in U.S. Pat. No. 3,359,109 and EP-A 941,866. Preferred are derivatives of the leuco dyes which contain $R^{12}R^{13}N$-substituents wherein each of $R^{12}$ and $R^{13}$ is independently selected from hydrogen, $C_1$–$C_{10}$ alkyl, 2-hydroxyethyl and 2-cyanoethyl groups.

Leuco forms of aminotriarylmethane dyes are preferred. Most preferred are aminotriarylmethane compounds where at least two of the aryl groups have a $R^{12}R^{13}N$-substituent in the para position to the bond to the methane carbon atom. The third aryl group may be the same as or different from the first two. When this third aryl group is different then it is, preferably, selected from phenyl (which is optionally substituted with one or more substituents selected from the group consisting of $C_1$–$C_8$ alkyl, $C_1$–$C_8$ alkoxy, chlorine, diphenylamino, cyano, nitro, hydroxy, fluorine and bromine), naphthyl (which may be substituted with amino or dialkylamino groups), pyridyl, quinolyl or indolinylidene substituents (each of which may be unsubstituted or substituted with $C_1$–$C_8$ alkyl, $C_1$–$C_8$ alkoxy, chlorine, bromine or cyano groups).

The most preferred triphenylmethane leuco dyes are the following: leuco crystal violet, leuco ethyl crystal violet and leuco malachite green.

According to the present invention one leuco dye is sufficient, however, it is also within the scope of the present invention to use a mixture of two or more leuco dyes.

The leuco dye is preferably present in the IR sensitive composition in an amount of from 0.5 to 8 wt. %, based on the total solids content of the IR sensitive composition; more preferably the amount is from 1 to 5 wt. % and most preferably from 1.5 to 4 wt. %.

Without wishing to be bound by any particular theory, and recognizing that the exact mechanism of the initator system is not known with certainty, it is presently believed that in order to achieve a high degree of radiation sensitivity, the presence of all four components is indispensable. The generation of free radicals starts with an electron transfer process between the excited IR dye molecule and the polyhaloalkyl compound. It was found that completely radiation-insensitive compositions were obtained when component (b) was missing. The polycarboxylic acid (c) is also necessary to obtain the required thermal stability of a radiation-sensitive composition. If the polycarboxylic acid is replaced for example by compounds having a mercapto group or by ammonium borates the radiation sensitivity can be slightly decreased, and the thermal stability of compositions containing borates can be insufficient.

It was found by the inventors that it is important for the present invention that the oxidation potential of the compound capable of absorbing IR radiation (component a) is less than the reduction potential of the used polyhaloalkyl-substituted compound (component b) plus 1.6 eV.

Basically all polymers or polymer mixtures known in the art can be used as polymeric binders, for example acrylic acid copolymers and methacrylic acid copolymers. Preferably, the polymers have a weight-average molecular weight in the range of 10,000 to 1,000,000 (determined by means of GPC). In view of possible problems occurring in connection with ink acceptance during the printing process, it is preferred that the used polymer has an acid number of >70 mg KOH/g, or, when polymer mixtures are used, that the arithmetic average of the individual acid numbers be >70 mg KOH/g. A polymer or polymer mixture with an acid number of >110 mg KOH/g is preferred; especially preferred is an acid number between 140 and 160 mg KOH/g. The content of the polymeric binder in the IR-sensitive composition preferably accounts for 30 to 60 wt.-%, more preferably 35 to 45 wt.-%, based on the total solids content of the IR-sensitive composition.

As unsaturated free radical polymerizable monomers or oligomers, use can be made of for example acrylic or methacrylic acid derivatives with one or more unsaturated groups, preferably esters of acrylic or methacrylic acid in the form of monomers, oligomers or prepolymers. They may be present in solid or liquid form, with solid and highly viscous forms being preferred. The compounds suitable as monomers include for instance trimethylol propane triacrylate and methacrylate, pentaerythrite triacrylate and methacrylate, dipentaerythritemono hydroxy pentaacrylate and methacrylate, dipentaerythrite hexaacrylate and methacrylate, pentaerythrite tetraacrylate and methacrylate, ditrimethylol propane tetraacrylate and methacrylate, diethyleneglycol diacrylate and methacrylate, triethyleneglycol diacrylate and methacrylate or tetraethyleneglycol diacrylate and methacrylate. Suitable oligomers and/or prepolymers are urethane acrylates and methacrylates, epoxide acrylates and methacrylates, polyester acrylates and methacrylates, polyether acrylates and methacrylates or unsaturated polyester resins.

Besides monomers and oligomers polymers having C═C bonds in the back bone and/or in the side chains can be used. Examples thereof include: reaction products of maleic anhydride-olefin-copolymers and hydroxyalkyl(meth) acrylates, polyesters containing an allyl alcohol group, reaction products of polymeric poly-alcohols and isocyanate (meth)acrylates, unsaturated polyesters and (meth)-acrylate terminated polystyrenes, poly(meth)acrylics and polyethers.

The weight ratio of the free radical polymerizable monomers or oligomers is preferably 35 to 60 wt.-%, more preferably 45 to 55 wt.-%, based on the total solids content of the IR-sensitive composition.

The IR-sensitive compositions of the present invention may furthermore comprise a softening agent. Suitable softening agents include inter alia dibutyl phthalate, triaryl phosphate and dioctyl phthalate. If a softening agent is used, it is preferably present in an amount in the range of 0.25 to 2 wt.-%.

The IR-sensitive composition may furthermore comprise colorants for improving the color contrast between image area and non-image area. Suitable colorants are those that dissolve well in the solvent or solvent mixture used for coating or are easily introduced in the disperse form of a pigment; they include inter alia rhodamine dyes, triarylmethane dyes, methyl violet, anthrachinone pigments and phthalocyanine dyes and/or pigments. In a preferred embodiment of the present invention no such colorants are present; in general the presence of the leuco dye provides excellent color contrast between the image areas and non-image areas so that no colorant is necessary.

The IR-sensitive compositions of the present invention are preferably usable for the manufacture of printing plate precursors. In addition, however, they may be used in recording materials for creating images on suitable carriers and receiving sheets, for creating reliefs that may serve as printing plates, screens and the like, as etch resists, as radiation-curable varnishes for surface protection and for the formulation of radiation-curable printing inks.

For the manufacture of offset printing plate precursors, conventional carriers can be used; the use of an aluminum carrier is especially preferred. When an aluminum carrier is used it is preferred that it is first roughened by brushing in a dry state, brushing with an abrasive suspension or electrochemically, e.g. in an hydrochloric acid electrolyte; the roughened plates, which were optionally anodically oxidized in sulfuric or phosphoric acid, are then subjected to a hydrophilizing aftertreatment, preferably in an aqueous solution of polyvinyl-phosphonic acid or phosphoric acid. The details of the above-mentioned substrate pretreatment are well-known to the person skilled in the art.

The dried plates are then coated with the inventive IR-sensitive compositions from organic solvents or solvent mixtures such that dry layer weights of preferably from 0.5 to 4 $g/m^2$, more preferably 0,8 to 3 $g/m^2$, are obtained.

On top of the IR-sensitive layer, an oxygen-impermeable layer is applied as it is known in the art, e.g. a layer of polyvinyl alcohol, polyvinyl alcohol/polyvinyl acetate copolymers, polyvinyl pyrrolidon, polyvinyl pyrrolidon/polyvinyl acetate co-polymers, polyvinyl methylether, polyacrylic acid, polyvinylimidazole and gelatine. These polymers can be used alone or as combinations. The dry layer weight of the oxygen-impermeable layer is preferably 0.1 to 4 $g/m^2$, more preferably 0.3 to 2 $g/m^2$. This overcoat is not only useful as oxygen barrier but also protects the plate against ablation during exposure to IR radiation.

The thus obtained printing plate precursors are exposed with semiconductor lasers or laser diodes which emit in the range of 800 to 1,100 nm. Such a laser beam can be digitally controlled via a computer, i.e. it can be turned on or off so that an imagewise exposure of the plates can be effected via stored digitalized information in the computer. Therefore, the IR-sensitive compositions of the present invention are suitable for creating what is referred to as computer-to-plate (ctp) printing plates.

After the printing plate precursor has been imagewise exposed, it is briefly heated to a temperature of 85 to 135° C. in order to effect complete curing of the exposed areas. Depending on the temperature applied, this only takes 20 to 100 seconds.

Then the plates are developed as known to the person skilled in the art. The developed plates are usually treated with a preservative ("gumming"). The preservatives are aqueous solutions of hydrophilic polymers, wetting agents and other additives.

The following examples serve to provide a more detailed explanation of the invention.

Example 1

A coating solution was prepared from the following components:

| | |
|---|---|
| 3.2 g | Ioncryl 683 ® (acrylic acid copolymer from SC Johnson & Son Inc. having an acid number of 175 mg KOH/g) |
| 4.0 g | AC 50 (methacrylic copolymer available from PCAS having an acid number of 48 mg KOH/g, 70 wt.-% solution in methyl glycol) |
| 1.4 g | dipentaerythritol pentaacrylate |
| 8.4 g | of an 80 wt.-% methyl ethyl ketone solution of a urethane acrylate prepared by reacting 1-methyl-2,4-bis-isocyanate benzene (Desmodur N100 ® available from Bayer) with hydroxy ethyl acrylate and pentaerythritol triacrylate |

-continued

| | |
|---|---|
| | having a double-bond content of 0.50 double bonds/100 g when all isocyanate groups are completely reacted |
| 0.4 g | anilino diacetic acid |
| 0.18 g | 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride |
| 0.28 g | leuco crystal violet |
| 0.75 g | 2-(4-methoxyphenyl)-4,6-bis-(trichlormethyl)-s-triazine |

These components were dissolved under stirring in 100 ml of a mixture comprising 90 parts by volume 1-methoxy-2-propanol 10 parts by volume acetone.

After filtration, the solution was applied to an electrochemically grained and anodized aluminum foil that was subjected to an aftertreatment using an aqueous solution of polyvinyl phosphonic acid by means of common methods and the coating was dried for 4 minutes at 90° C. The dry weight of the radiation-sensitive layer amounts to approximately 2 $g/m^2$.

Then, an oxygen-impermeable layer of 2 $g/m^2$ dry layer weight was applied by applying a coating of a solution of the following composition:

| | |
|---|---|
| 42.5 g | polyvinyl alcohol (Airvol 203 ® available from Air Products; 12 wt.-% residual acetyl groups) |
| 7.5 g | polyvinyl imidazole (PVI available from Panchim) |
| 170 g | water. |

Drying took place for 5 minutes at 90° C.

The thus prepared precursor was exposed using a Trendsetter 3244 of the company Creo with a 830 nm laser diode. The UGRA/FOGRA Postscript Strip version 2.0 EPS (available from UGRA), which contains different elements for evaluating the quality of the copies, was used for imaging.

Then the plate was processed in the commercially available processor MercuryNews (Kodak Polychrome Graphics LLC), equipped with a preheat section, a prewash section, an immersion type developing bath, a section for rinsing with water, and a gumming and a drying section. The processor was filled with developer 980 (Kodak Polychrome Graphics LLC). The following settings were used for processing of the plate: speed 120 cm/min, preheat 630, prewash rate 0.5 l/sqm plate, temperature of the developing bath (23±1)° C.

To evaluate the copy obtained after preheating and developing, the following criteria were examined: color contrast between non-image and image areas (ΔOD), quality of the reproduction of the 1 pixel elements, optical density of the checkerboard dots of the pixel elements, and optical density of a solid element.

For determination of color contrast, the density of solids and screen dots, the apparatus D19/D196 from Gretag/Macbeth was used.

The color contrast of processed plates between exposed and unexposed areas was determined directly after processing to be ΔOD=0.16. After storage of this plate in a day light room for several hours the color contrast value increases. The results for energy requirements show that for a good reproduction of the solids an exposure energy of 51 $mJ/cm^2$ and for 1 pixel elements one of 82 mJ/ $cm^2$ is required.

The plate was mounted in a sheet-fed offset press and proofed. The image areas accepted ink without any problems and the paper copies did not show any toning in the non-image areas. After 250.000 good impressions the print was stopped, however, the plate could have been used for more prints.

In order to simulate the solvent resistance of the exposed, subsequently heated and developed layers, the layer loss of a printing plate whose entire surface had been exposed using 60 $mJ/cm^2$ was determined by subjecting it to exemplary solvents at room temperature for one hour. The loss is 6.1 wt.-% in the case of diacetone alcohol and only 2.2 wt.-% in the case of toluene. These low values indicate a high solvent resistance.

Example 2

The work was performed as in Example 1 using 0.60 g leuco crystal violet. The color contrast was found to be ΔOD=0.15, and the energy required for solids was 50 $mJ/cm^2$, and for 1 pixel elements 80 $mJ/cm^2$. These results show that by increasing the concentration of leuco crystal violet the color contrast and energy parameters remain almost constant.

Example 3

The work was performed as in Example 1 using 0.30 g leuco malachite green instead of leuco crystal violet. The color contrast of this plate was ΔOD=0.12, the energy needed for solids was 53 $mJ/cm^2$, and for 1 pixel elements 81 $mJ/cm^2$.

Example 4

The work was performed as in Example 1 using 0.28 g leuco crystal violet and 0.13 g crystal violet. The color contrast of this plate was ΔOD =0.62, the energy needed for solids was 52 $mJ/cm^2$, and for 1 pixel elements 82 $mJ/cm^2$.

Example 5

Example 1 was repeated with the following coating solution:

| | |
|---|---|
| 2.5 g | Scripset 540 ® (butyl semi-ester of maleic anhydride/styrene copolymer of Monsanto Co.) |
| 3.4 g | of a 80 wt.-% methyl ethyl ketone solution of a urethane acrylate prepared by reacting 1-methyl-2,4-bis-isocyanate benzene (Desmodur N100 ® available from Bayer) with hydroxy ethyl acrylate and pentaerythritol triacrylate having a double-bond content of 0.50 double bonds/100 g when all isocyanate groups are completely reacted |
| 0.55 g | dipentaerythritol pentaacrylate |
| 0.18 g | anilino diacetic acid |
| 0.32 g | 2-[2-[2-chloro-3-[2-ethyl-(3H-benzthiazole)-2-ylidene]-1-cyclohexen-1-yl]-ethenyl]-3-ethyl-benzthiazolium tosylate |
| 0.32 g | tribromomethylphenylsulfone |
| 0.26 g | leuco crystal violet. |

The plate precursor was exposed and processed as described in Example 1. The color contrast was found to be ΔOD=0.14, and the energy required for solids 53 $mJ/cm^2$, and for 1 pixel elements 82 $mJ/cm^2$. It is obvious that the exchange of both the s-triazine derivative and the IR dye does not cause a change in the IR sensitivity values.

Example 6

A coating solution was prepared from the following components:

| | |
|---|---|
| 1.6 g | Ioncryl 683 ® (acrylic copolymer from SC Johnson & Son Inc. having and acid number of 175 mg KOH/g) |
| 1.6 g | Terpolymer (methacrylic copolymer available from Panchim having an acid number of 130 mg KOH/g) |
| 1.4 g | dipentaerythritol pentaacrylate |
| 4.2 g | of a 80 wt.-% methyl ethyl ketone solution of an urethane acrylate prepared by reacting 1-methyl-2,4-bis-isocyanate benzene (Desmodur N100 ® available from Bayer) with hydroxy ethyl acrylate and pentaerythritol triacrylate having a double-bond content of 0.50 double bonds/100 g when all isocyanate groups are completely reacted) |
| 0.2 g | anilino diacetic acid |
| 0.10 g | 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride |
| 0.10 g | triphenyl methane |
| 0.08 g | crystal violet |
| 0.75 g | 2-(4-methoxyphenyl)-4,6-bis-(trichlormethyl)-s-triazine |

The plate precursor was exposed and processed as described in Example 1. The contrast was found to be ΔOD=0.41, and the energy required for solids 52 $mJ/cm^2$, and for 1 pixel elements 82 mJ/ $cm^2$. It is obvious that the exchange of the leuco crystal violet does not cause a change in the IR sensitivity values.

Example 7

The work was performed as in Example 1 using 0,41 g benzylamino diacetic acid instead of anilino diacetic acid. The color contrast of this plate was ΔOD=0.1 5, the energy needed for solids was 53 $mJ/cm^2$, and for 1 pixel elements 84 $mJ/cm^2$. It is obvious that replacing anilino diacetic acid by benzylamino diacetic acid does not cause a change in IR sensitivity.

In order to test for the solvent resistance of the exposed, subsequently heated and developed layers, the layer loss of a printing plate whose entire surface had been exposed using 60 $mJ/cm^2$ was determined by subjecting it to exemplary solvents at room temperature for one hour. The loss is 7.5 wt.-% in the case of diacetone alcohol and only 2.5 wt.-% in the case of toluene. These low values indicate a high solvent resistance.

The plate was mounted in a sheet-fed offset press and proofed. The image areas accepted ink without any problems and the paper copies did not show any toning in the non-image areas. After 220.000 good impressions the print was stopped, however, the plate could have been used for more prints.

Example 8

A coating solution was prepared from the following components:

| | |
|---|---|
| 2.5 g | Scripset 540 ® (butyl semi-ester of maleic anhydride/styrene copolymer of Monsanto Co.) |
| 3.4 g | of a 80 wt.-% methyl ethyl ketone solution of a urethane acrylate prepared by reacting 1-methyl-2,4-bis-isocyanate benzene (Desmodur N100 ® available of Bayer) with hydroxy ethyl acrylate and pentaerythritol triacarylate having a double-bond content of 0.50 double bonds/100 g when all isocyanate groups are completely reacted |

-continued

| | |
|---|---|
| 0.55 g | dipentaerythritol pentaacrylate |
| 0.20 g | tri-sodium salt of N-hydroxyethyl ethylene diamine tri-acetic acid |
| 0.29 g | 2-[2-[2-phenylsulfonyl-3-[2-(1,3-dihydro-1,3,3-trimethyl-2H-indol-2-ylidene)-ethylidene]-1-cychexen-1-yl]-ethenyl]-1,3,3-trimethyl-3H-indoliumchlorid |
| 0.32 g | 2-phenyl-4,6-bis-(trichlormethyl)-s-triazine |
| 0.15 g | leuco malchite green |

The plate precursor was exposed and processed as described in Example 1. The color contrast was found to be ΔOD=0.12, and the energy required for solids 97 $mJ/cm^2$, and for 1 pixel elements 124 $mJ/cm^2$.

Example 9

A coating solution was prepared from the following components:

| | |
|---|---|
| 2.5 g | CAP ® (cellulose acetate phthalate of Eastman Kodak Co. Having an acid number of 135 mg KOH/g) |
| 3.4 g | of a 80 wt.-% methyl ethyl ketone solution of a urethane acrylate prepared by reacting 1-methyl-2,4-bis-isocyanate benzene (Desmodur N100 ® available of Bayer) with hydroxy ethyl acrylate and pentaerythritol triacarylate having a double-bond content of 0.50 double bonds/100 g when all isocyanate groups are completely reacted |
| 0.55 g | dipentaerythritol pentaacrylate |
| 0.20 g | calcium tri-sodium salt of diethylene triamine penta-acetic acid |
| 0.32 g | NK 2911 (IR dye available of Nippon Kankoh-Shikiso Kenkyusho Co.) |
| 0.32 g | 2-phenyl-4,6-bis-(trichlormethyl)-s-triazine |
| 0.12 g | leuco crystal violet |

The plate precursor was exposed and processed as described in Example 1. The color contrast was found to be ΔOD=0.15, and the energy required for solids 104 $mJ/cm^2$, and for 1 pixel elements 131 $mJ/cm^2$.

A plate exposed using 131 $mJ/cm^2$ was mounted in a sheet-fed offset press and proofed. The image areas accepted ink without any problems and the paper copies did not show any toning in the non-image areas. After 220.000 good impressions the print was stopped, however, the plate could have been used for more prints.

Comparative Example 1

The work was performed as in Example 1 using 0.28 g crystal violet instead of leuco crystal violet. The energy needed to create solids was 76 $mJ/cm^2$ and 102 $mJ/cm^2$ for the 1 pixel elements. The color contrast is determined to be ΔOD=0.85.

These findings show that the replacement of leuco crystal violet by crystal violet, which functions as contrast dye only, in Example 1 leads to a formulation which requires higher IR energy to give good solids or 1 pixel elements Comparative Example 2

The work was performed as in Example 1 using 0.25 g Julolidine (2,3,6,7-tetrahydro-1H,5H-benzo[ij]quinolizine) instead of leuco crystal violet. The energy needed to create solids was 97 $mJ/cm^2$ and for the 1 pixel elements 122 $mJ/cm^2$. The color contrast of the processed plate was ΔOD=0.06 only.

These results show that the replacement of leuco crystal violet by Julolidine leads to formulations which require higher IR energies even as Comparative Example 1. Furthermore, the color contrast ΔOD is not sufficient for a practical application.

Comparative Example 3

The work was performed as in Exampel 9 using 0.14 g crystal violet instead of lecuo crystal violet. The color contrast was found to be ΔOD=0.84, and the energy required for solids 131 mJ/$cm^2$, and for 1 pixel elements 166 mJ/$cm^2$. These findings show that the replacement of leuco crystal violet in Example 9 by crystal violet, which functions as coloring dye only, leads to a formulation which requires higher IR energy to give good solids or 1 pixel elements.

We claim:

1. Initiator system comprising:

(a) at least one compound capable of absorbing IR radiation selected from the group consisting of triarylamine dyes, thiazolium dyes, indolium dyes, oxazolium dyes, cyanine dyes, polyaniline dyes, polypyrrole dyes, polythiophene dyes and phthalocyanine pigments, (b) at least one polyhaloalkyl-substituted compound capable of producing radicals (c) at least one polycarboxylic acid represented by the following formula I $$R^4—(CR^5R^6)_r—Y—CH_2COOH \qquad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with —COOH, $R^8$ is selected from the group consisting of —$CH_2COOH$, —$CH_2OH$ and —$(CH_2)_2N(CH_2COOH)_2$ and r is 0, 1, 2 or 3 and wherein at least one of $R^4$, $R^5$, $R^6$, $R^7$ and $R^8$ includes a —COOH group, or a salt thereof, and (d) at least one leuco dye, wherein:

$$ox_a < red_b + 1.6 eV$$

where $ox_a$=oxidation potential of component (a) in eV $red_b$=reduction potential of component (b) in eV.

2. Initiator system according to claim 1 wherein the compound capable of absorbing IR-radiation is a cyanine dye.

3. Initiator system according to claim 2 wherein the compound capable of absorbing IR-radiation is a cyanine dye of the formula (A)

(A)

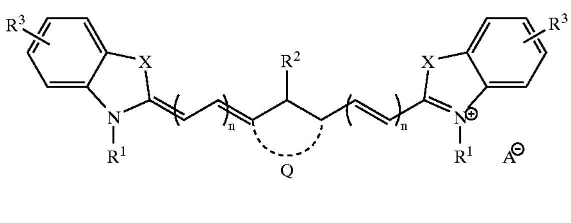

wherein:

each X independently represents S, O, NR or C(alkyl)$_2$;

each $R^1$ independently is an alkyl group, an alkylsulfonate or an alkylammonium group;

$R^2$ represents hydrogen, halogen, SR, $SO_2R$, OR or $NR_2$;

each $R^3$ independently represents a hydrogen atom, an alkyl group, COOR, OR, SR, $NR_2$, a halogen atom or an optionally substituted benzofused ring;

$A^-$ represents an anion;

- - Q - - represents an optional carbocyclic five- or six-membered ring;

each R independently represents hydrogen, an alkyl or aryl group;

each n independently is 0, 1, 2 or 3.

4. Initiator system according to claim 1, wherein the compound capable of absorbing IR-radiation is selected from the group consisting of 2-[2-[2-thiophenyl-3-[2-(1,3-dihydro-1,3,3-trimethyl-2H-indol-2-ylidene)-ethylidene]-1-cyclopenten-1-yl]-ethenyl]- 1,3,3-trimethyl-3H-indoliumtosylate 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride, 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride, 2-[2-[2-chloro-3-[2-(1,3-dihydro-1,3,3-trimethyl-2H-indol-2-ylidene]-ethylidene]-1-cyclohexen-1-yl]-ethenyl]-1,3,3-trimethyl-3H-indolium-tosylate and 2-[2-[2-chloro-3-[2-ethyl-(3H-benzthiazol-2-ylidene)-ethylidene]1-cyclohexen-1-yl]-ethenyl]-3-ethyl-benzthiazolium-tosylate.

5. Initatior system according to claim 1, wherein the compound capable of producing radicals is selected from the group consisting of 2-phenyl-4,6-bis-(trichloromethyl)-s-triazine, 2-(4-methoxyphenyl)-4,6-bis(trichloromethyl)-s-triazine, tribromomethylphenylsulfone, 2,4,6-tri(trichloromethyl)-s-triazine and 1,2,3,4-tetrabromo-n-butane.

6. Initiator system according to claim 1, wherein the polycarboxylic acid is a compound selected from the group consisting of (B)

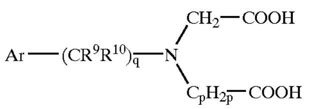

and (C)

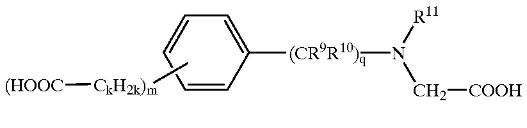

wherein Ar represents a mono-, poly- or unsubstituted aryl group, p is an integer from 1 to 5, $R^9$ and $R^{10}$ are independently selected from the group consisting of hydrogen and $C_1$–$C_4$ alkyl and q is 0 or an integer from 1 to 3, $R^{11}$ represents a hydrogen atom or a $C_1$–$C_6$ alkyl group and k and m each are an integer from 1 to 5.

7. Initiator system according to claim 6, wherein the polycarboxylic acid is selected from the group consisting of anilino diacetic acid and N-(carboxymethyl)-N-benzyl-glycine.

8. Initiator system according to claim 1, wherein the polycarboxylic acid is an aliphatic polyacetic acid with all —$CH_2COOH$ groups being bonded to at least one nitrogen atom.

9. Initiator system according to claim 8, wherein the polycarboxylic acid is selected from the group consisting of ethylene diamine tetra-acetic acid, nitrilo tri-acetic acid, diethylene triamine penta-acetic acid and N-hydroxyethyl ethylene diamine tri-acetic acid.

10. Initator system according to claim 1, wherein the leuco dye is selected from the group consisting of triarylmethanes, thioxanthenes, 9,10-dihydro-acridines and phenoxazines.

11. IR-sensitive composition comprising:

(i) an initiator system comprising (a) at least one compound capable of absorbing IR radiation selected from the group consisting of triarylamine dyes, thiazolium dyes, indolium dyes, oxazolium dyes, cyanine dyes, polyaniline dyes, polypyrrole dyes, polythiophene dyes and phthalocyanine pigments, (b) at least one polyhaloalkyl-substituted compound capable of producing radicals (c) at least one polycarboxylic acid represented by the following formula I $$R^4—(CR^5R^6)_r—Y—CH_2COOH \quad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with —COOH, $R^8$ is selected from the group consisting of —$CH_2COOH$, —$CH_2OH$ and —$(CH_2)_2N(CH_2COOH)_2$ and r is 0, 1, 2 or 3 wherein at least one of $R^4$, $R^5$, $R^6$, $R^7$ and $R^8$ includes a —COOH group, or a salt thereof, and (d) at least one leuco dye, wherein:

$$ox_a < red_b + 1.6 eV$$

where $ox_a$ oxidation potential of component (a) in eV $red_b$ reduction potential of component (b) in eV (ii) at least one component selected from the group consisting of unsaturated free radical polymerizable monomers, oligomers which are free radical polymerizable and polymers containing C═C bonds wherein the C═C bonds are located in at least one selected from the group consisting of the back bone of the polymers and the side chain groups of the polymers, and (iii) at least one polymeric binder.

12. Composition according to claim 11, wherein the compound capable of absorbing IR-radiation is a cyanine dye of the formula (A)

(A)

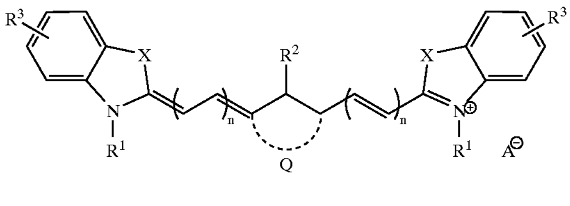

wherein:

each X independently represents S, O, NR or $C(alkyl)_2$;

each $R^1$ independently is an alkyl group, an alkylsulfonate or an alkylammonium group;

$R^2$ represents hydrogen, halogen, SR, $SO_2R$, OR or $NR_2$ ;

each $R^3$ independently represents a hydrogen atom, an alkyl group, COOR, OR, SR, $NR_2$, a halogen atom or an optionally substituted benzofused ring;

A–represents an anion; - - Q - - represents an optional bridge completing a carbocyclic five- or six- membered ring;

each R independently represents hydrogen, an alkyl or aryl group;

each n independently is 0, 1, 2 or 3.

13. Composition according to claim 11, wherein the compound capable of producing radicals is selected from the group consisting of 2-phenyl-4,6-bis-(trichloromethyl)-s-triazine, 2-(4-methoxyphenyl)-4,6-bis(trichloromethyl)-s-triazine, tribromomethylphenylsulfone, 2,4,6-tri(trichloromethyl)-s-triazine and 1,2,3,4-tetrabromo-n-butane.

14. Composition according to claim 11, wherein the polyearboxylic acid is selected from the group consisting of (B)

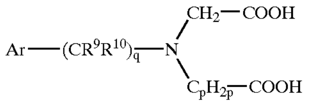

and (C)

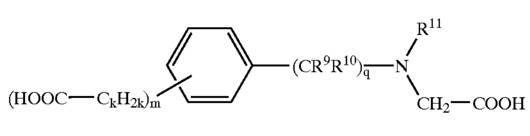

wherein Ar represents a mono-, poly- or unsubstituted aryl group, p is an integer from 1 to 5, $R^5$ and $R^6$ are independently selected from the group consisting of hydrogen and $C_1$–$C_4$ alkyl, q is 0 or an integer from 1 to 3, $R^{11}$ represents a hydrogen atom or a $C_1$–$C_6$ alkyl group and k and m each are an integer from 1 to 5.

15. Composition according to claim 11 wherein the polycarboxylic acid is an aliphatic polyacetic acid with all —$CH_2COOH$ being bonded to at least one nitrogen atom.

16. Composition according to claim 11, wherein the leuco dye is selected from the group consisting of triarylmethanes, thioxanthenes, 9,10-dihydro-acridines and phenoxazines.

17. Composition according to claim 11, wherein the polymeric binders have an acid number of >70 mg KOH/g.

18. Printing plate precursor, comprising a coating with an IR-sensitive composition, the IR-sensitive composition including (i) an initiator system comprising (a) at least one compound capable of absorbing IR radiation selected from the group consisting of triarylamine dyes, thiazolium dyes, indolium dyes, oxazolium dyes, cyanine dyes, polyaniline dyes, polypyrrole dyes, polythiophene dyes and phthalocyanine pigments (b) at least one polyhaloalkyl-substituted compound capable of producing radicals, (c) at least one polycarboxylic acid represented by the following formula I $$R^4—(CR^5R^6)_r—Y—CH_2COOH \quad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, $—CH_2CH_2OH$, and $C_1$–$C_5$ alkyl substituted with —COOH, $R^8$ is selected from the group consisting of $—CH_2COOH$, $—CH_2OH$ and $—(CH_2)_2N(CH_2COOH)_2$ and r is 0, 1, 2 or 3 wherein at least one of $R^4$, $R^5$, $R^6$, $R^7$ and $R^8$ includes a —COOH group, or a salt thereof, and (d) at least one leuco dye, wherein:

$$ox_a < red_b + 1.6 eV$$

where $ox_a$=oxidation potential of component (a) in eV $red_b$=reduction potential of component (b) in eV (ii) at least one component selected from the group consisting of unsaturated free radical polymerizable monomers, oligomers which are free radical polymerizable and polymers containing C═C bonds wherein the C═C bonds are located in at least one selected from the group consisting of the back bone of the polymers and the side chain groups of the polymers, and (iii) at least one polymeric binder.

19. Printing plate precursor according to claim 18, wherein the compound of absorbing IR-radiation is a cyanine dye of the formula (A)

(A)

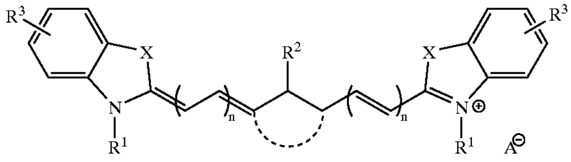

wherein each X independently represents S, O, NR or $C(alkyl)_2$;

each $R^1$ independently is an alkyl group, an alkylsulfonate or an alkylammonium group;

$R^2$ represents hydrogen, halogen, SR, $SO_2R$, OR or $NR_2$;

each $R^3$ independently represents a hydrogen atom, an alkyl group, COOR, OR, SR, $NR_2$, a halogen atom or an optionally substituted benzofused ring;

A–represents an anion;

- - Q - - represents an optional bridge completing a carbocyclic five- or six- membered ring;

each R independently represents hydrogen, an alkyl or aryl group;

each n independently is 0, 1, 2 or 3.

20. Printing plate precursor according to claim 18, wherein the compound capable of producing radicals is selected from the group consisting of 2-phenyl-4,6-bis-(trichloromethyl)-s-triazine, 2-(4-methoxyphenyl)-4,6-bis(trichloromethyl)-s-triazine, tribromomethylphenylsulfone, 2,4,6-tri(trichloromethyl)-s-triazine and 1,2,3,4-tetrabromo-n-butane.

21. Printing plate precursor according to claim 18, wherein the polycarboxylic acid is a compound selected from the group consisting of (B)

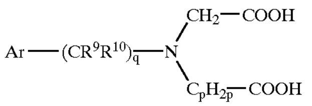

and (C)

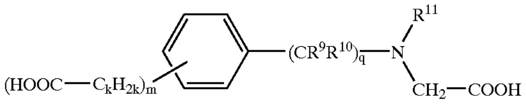

wherein Ar represents a mono-, poly- or unsubstituted aryl group, p is an integer from 1 to 5, $R^9$ and $R^{10}$ are independently selected from the group consisting of hydrogen and $C_1$–$C_4$ alkyl, q is 0 or an integer from 1 to 3, $R^{11}$ represents a hydrogen atom or a $C_1$–$C_6$ alkyl group and k and m each are an integer from 1 to 5.

22. Printing plate precursor according to claim 18 wherein the polycarboxylic acid is an aliphatic polyacetic acid with all $—CH_2COOH$ groups being bonded to at least one nitrogen atom.

23. Printing plate precursor according to claim 18, wherein the leuco dye is selected from the group consisting of triarylmethanes, thioxanthenes, 9,10-dihydroacridines and phenoxazines.

24. Composition according to claim 11, further comprising a contrast-enhancing colorant.

25. Composition according to claim 11, wherein the IR-sensitive composition comprises 0.5 to 8 wt.-% of the leuco dye, based on the total solids content of the composition.

26. Composition according to claim 11, wherein the IR-sensitive composition comprises 1 to 5 wt.-% of the leuco dye, based on the total solids content of the composition.

27. Composition according to claim 11, wherein the IR-sensitive composition comprises 1.5 to 4 wt.-% of the leuco dye, based on the total solids content of the composition.

28. Printing plate precursor according to claim 18, wherein the IR-sensitive composition further comprises a contrast-enhancing colorant.

29. Printing plate precursor according to claim 18, wherein the IR-sensitive composition comprises 0.5 to 8 wt.-% of the leuco dye, based on the total solids content of the composition.

30. Printing plate precursor according to claim 18, wherein the IR-sensitive composition comprises 1 to 5 wt.-% of the leuco dye, based on the total solids content of the composition.

31. Printing plate precursor according to claim 18, wherein the IR-sensitive composition comprises 1.5 to 4 wt.-% of the leuco dye, based on the total solids content of the composition.

32. Printing plate precursor according to claim 18, further comprising an oxygen-impermeable overcoat.

* * * * *

UNITED STATES PATENT AND TRADEMARK OFFICE
CERTIFICATE OF CORRECTION

PATENT NO. : 6,864,040 B2
DATED : March 8, 2005
INVENTOR(S) : Ursula Muller et al.

It is certified that error appears in the above-identified patent and that said Letters Patent is hereby corrected as shown below:

Column 20,
Line 10, after the word “optional” insert -- bridge completing a --

Column 21,
Line 56, delete the equation “$ox_a$” and replace it with -- $ox_a =$ --
Line 58, delete the equation “$red_b$” and replace it with -- $red_b =$ --

Column 22,
Line 41, delete the word “polyearboxylic” and replace it with -- polycarboxylic --
Line 55, delete the phrase “$R^5$ and $R^6$” and replace it with -- $R^9$ and $R^{10}$ --

Column 23,
Line 51, after the word “compound” insert the word -- capable --
Line 55, chemical formula A, that portion of the formula reading

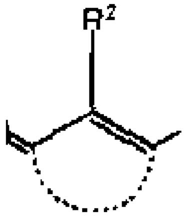

should read

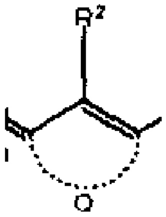

Signed and Sealed this

Twenty-sixth Day of July, 2005

JON W. DUDAS
*Director of the United States Patent and Trademark Office*